US010138556B2

(12) United States Patent
Mizutani et al.

(10) Patent No.: US 10,138,556 B2
(45) Date of Patent: Nov. 27, 2018

(54) PLATING METHOD, PLATING APPARATUS, AND STORAGE MEDIUM

(71) Applicant: Tokyo Electron Limited, Tokyo (JP)

(72) Inventors: Nobutaka Mizutani, Nirasaki (JP); Takashi Tanaka, Nirasaki (JP); Mitsuaki Iwashita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 225 days.

(21) Appl. No.: 14/404,205

(22) PCT Filed: May 27, 2013

(86) PCT No.: PCT/JP2013/064646
§ 371 (c)(1),
(2) Date: Nov. 26, 2014

(87) PCT Pub. No.: WO2013/180064
PCT Pub. Date: Dec. 5, 2013

(65) Prior Publication Data
US 2015/0147476 A1 May 28, 2015

(30) Foreign Application Priority Data
May 30, 2012 (JP) ................................. 2012-123621

(51) Int. Cl.
B05D 3/10 (2006.01)
C23C 18/16 (2006.01)
(Continued)

(52) U.S. Cl.
CPC ...... C23C 18/1619 (2013.01); C23C 18/1633 (2013.01); C23C 18/1651 (2013.01);
(Continued)

(58) Field of Classification Search
CPC ............ C23C 18/1619; C23C 18/1633; C23C 18/1683; C23C 18/1676; C23C 18/1651
See application file for complete search history.

(56) References Cited

U.S. PATENT DOCUMENTS

2002/0033340 A1* 3/2002 Cheung ............... C23C 18/1617
205/101
2004/0094511 A1 5/2004 Seo
(Continued)

FOREIGN PATENT DOCUMENTS

JP 2001-342573 A 12/2001
JP 2003-119568 A 4/2003
(Continued)

OTHER PUBLICATIONS

International Search Report for PCT/JP2013/064646 dated Aug. 27, 2013.

Primary Examiner — Dah-Wei D. Yuan
Assistant Examiner — Inga Leung V Law
(74) Attorney, Agent, or Firm — Pearne & Gordon LLP

(57) ABSTRACT

A plating method can improve uniformity in a thickness of a plating layer formed on an inner surface of a recess. The plating method includes a loading process of loading the substrate in which the recess is formed into a casing; and a plating process of supplying a plating liquid to the substrate and forming a plating layer having a specific function on an inner surface of the recess. The plating process includes a first plating process of supplying a first plating liquid to the substrate and forming a first plating layer; and a second plating process of supplying a second plating liquid to the substrate and forming a second plating layer on the first plating layer after the first plating process. Further, a concentration of an additive contained in the first plating liquid is different from a concentration of an additive contained in the second plating liquid.

7 Claims, 13 Drawing Sheets

(51) Int. Cl.
*H01L 21/288* (2006.01)
*H01L 21/768* (2006.01)
*C23C 18/18* (2006.01)
*C23C 18/50* (2006.01)

(52) U.S. Cl.
CPC ...... *C23C 18/1676* (2013.01); *C23C 18/1683* (2013.01); *C23C 18/1893* (2013.01); *C23C 18/50* (2013.01); *H01L 21/288* (2013.01); *H01L 21/76843* (2013.01); *H01L 21/76898* (2013.01)

(56) References Cited

U.S. PATENT DOCUMENTS

| | | | | |
|---|---|---|---|---|
| 2005/0196523 | A1* | 9/2005 | Marumo | C23C 18/1676 427/8 |
| 2006/0029727 | A1* | 2/2006 | Ivanov | B82Y 30/00 427/96.1 |

FOREIGN PATENT DOCUMENTS

| | | | | |
|---|---|---|---|---|
| JP | 2004-197168 A | 7/2004 | | |
| JP | WO 2005038088 A1 * | 4/2005 | ............ | C23C 18/40 |
| JP | 2010-177538 A | 8/2010 | | |
| JP | 2012-216722 A | 11/2012 | | |
| KR | 10-2004-0058953 A | 7/2004 | | |
| KR | 10-2006-0067454 A | 6/2006 | | |
| WO | 01/048800 A1 | 7/2001 | | |
| WO | 2005/038088 A1 | 4/2005 | | |

* cited by examiner

FIG. 16

PLATING METHOD, PLATING APPARATUS, AND STORAGE MEDIUM

CROSS-REFERENCE TO RELATED APPLICATION

This Application is a U.S. national phase application under 35 U.S.C. § 371 of PCT Application No. PCT/JP2013/064646 filed on May 27, 2013, which claims the benefit of Japanese Patent Application No. 2012-123621 filed on May 30, 2012, the entire disclosures of which are incorporated herein by reference.

TECHNICAL FIELD

The embodiments described herein pertain generally to a plating method of performing a plating process to a recess formed in a substrate, a plating apparatus, and a storage medium.

BACKGROUND

In general, there is formed a circuit wiring on a substrate such as a semiconductor wafer or a liquid crystal substrate for forming a semiconductor device. As a method of forming a wiring, there has been used a damascene method in which a recess such as a via or a trench for burying a wiring material such as copper is formed in the substrate and the wiring material is buried in the recess.

Further, in recent years, there has been made an attempt to reduce a mounting area of a part or a whole system by mounting multiple LSIs on a substrate using a three-dimensional mounting technology. In the three-dimensional mounting technology, a recess, e.g., a through-silicon-via (TSV), for burying a wiring material, which connects the LSIs, is formed, for example, in a substrate (e.g., a silicon substrate).

Between an inner surface of a recess in a substrate and a wiring formed in the recess, typically, there is formed a barrier film for suppressing diffusion of atoms constituting a wiring material into an insulting film (an oxide film, PI "polyimide", etc.) on the inner surface of the recess and into the substrate on a rear surface side thereof, or for improving adhesivity therebetween. Further, between the barrier film and the wiring, typically, there is formed a seed film for making it easy to bury the wiring material.

By way of example, in Patent Document 1, there is suggested a method in which a barrier film containing ruthenium is formed on an inner surface of a recess by sputtering, a seed film containing ruthenium and copper is formed on the barrier film by sputtering, and then, copper is buried in the recess by a plating process.

REFERENCES

Patent Document 1: Japanese Patent Laid-open Publication No. 2010-177538

DISCLOSURE OF THE INVENTION

Problems to be Solved by the Invention

In recent years, there has been developed a manufacturing technique employing a TSV. In this manufacturing technique, a height or a depth of a recess in the TSV is not in a range of several tens of nanometers to several hundreds of nanometers in a conventional pre-treatment process but in a range of several microns to several hundreds of microns. For this reason, the conventional manufacturing technique may be employed in some cases, but a different method may be needed in some cases.

By way of example, a sputtering method which has been typically used for forming a barrier film or a seed film has a high directionality. For this reason, if a recess has a great height or depth, it is difficult to sufficiently form a barrier film or a seed film on a lower portion of the recess.

In order to solve such problems, a plating method such as an electroplating process or an electroless plating process may be considered. However, if a recess has a small diameter and a great height or depth, a plating liquid within the recess has a low fluidity, which may cause nonuniformity in concentration distribution of the plating liquid between an upper portion of the recess and a lower portion thereof. If there is nonuniformity in the concentration distribution of the plating liquid within the recess, it can be assumed that a thickness of a plating layer such as a barrier film or a seed film formed on an inner surface of the recess varies depending on positions within the recess. By way of example, it can be assumed that a thickness of a plating layer formed on the lower portion of the recess may be smaller than that of a plating layer formed on the upper portion of the recess.

In view of the foregoing problems, example embodiments provide a plating method capable of improving uniformity in thickness of a plating layer formed on an inner surface of a recess, a plating apparatus, and a storage medium.

Means for Solving the Problems

In accordance with a first aspect, a plating method of performing an electroless plating process to a recess formed in a substrate includes a loading process of loading the substrate in which the recess is formed into a casing; and a plating process of supplying a plating liquid to the substrate and forming a plating layer having a specific function on an inner surface of the recess. The plating process includes a first plating process of supplying a first plating liquid to the substrate and forming a first plating layer; and a second plating process of supplying a second plating liquid to the substrate and forming a second plating layer on the first plating layer after the first plating process. Further, a concentration of an additive contained in the first plating liquid is different from a concentration of an additive contained in the second plating liquid.

In accordance with a second aspect, a plating apparatus of performing an electroless plating process to a recess formed in a substrate includes a substrate holding unit configured to hold the substrate in which the recess is formed; and a plating unit configured to supply a plating liquid to the substrate and form a plating layer having a specific function on an inner surface of the recess. The plating unit includes a first plating unit configured to supply a first plating liquid to the substrate; and a second plating unit configured to supply a second plating liquid to the substrate after the first plating liquid is supplied. Further, a concentration of an additive contained in the first plating liquid is different from a concentration of an additive contained in the second plating liquid.

In accordance with a third aspect, a computer-readable storage medium has stored thereon computer-executable instructions that, in response to execution, cause a plating apparatus to perform a plating method of performing an electroless plating process to a recess formed in a substrate. The plating method includes a loading process of loading the substrate in which the recess is formed into a casing; and a plating process of supplying a plating liquid to the substrate and forming a plating layer having a specific function on an inner surface of the recess. The plating process includes a first plating process of supplying a first plating liquid to the substrate and forming a first plating layer; and a second plating process of supplying a second plating liquid to the substrate and forming a second plating layer after the first plating process. Further, a concentration of an additive contained in the first plating liquid is different from a concentration of an additive contained in the second plating liquid.

Effect of the Invention

In accordance with the example embodiments, it is possible to improve uniformity in a thickness of a plating layer formed on an inner surface of a recess.

BRIEF DESCRIPTION OF THE DRAWINGS

FIG. 16 illustrates an example of a plating layer formed in an experimental example.

MODE FOR CARRYING OUT THE INVENTION

First Example Embodiment

Figure 1:
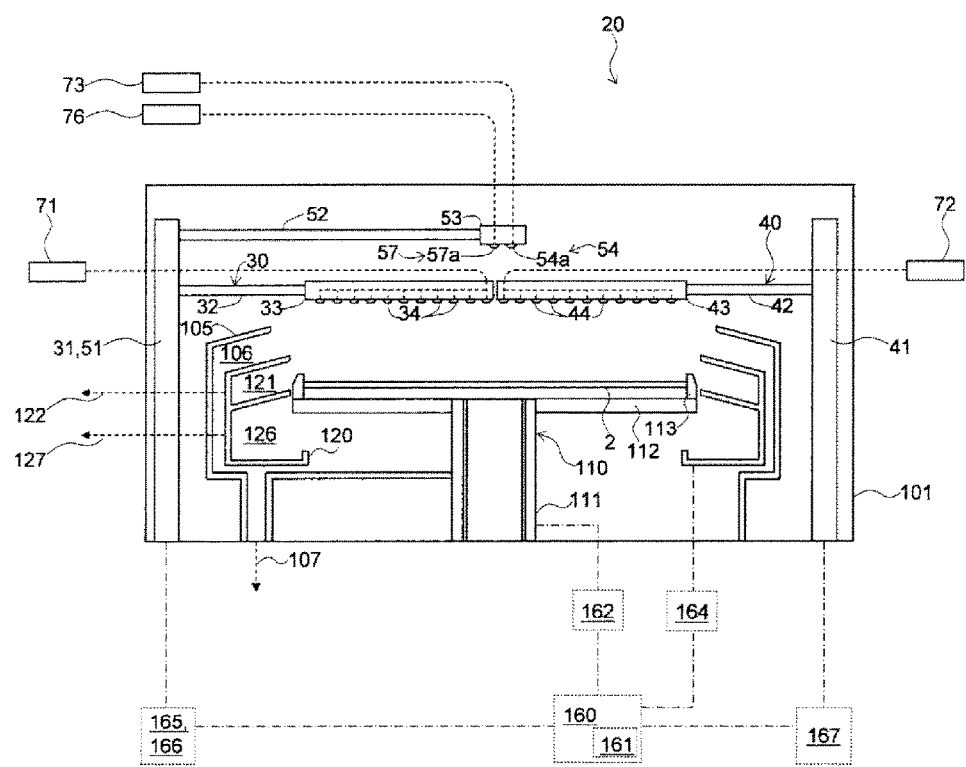
FIG. 1 is a side view illustrating a plating apparatus in accordance with a first example embodiment.
Figure 2A:
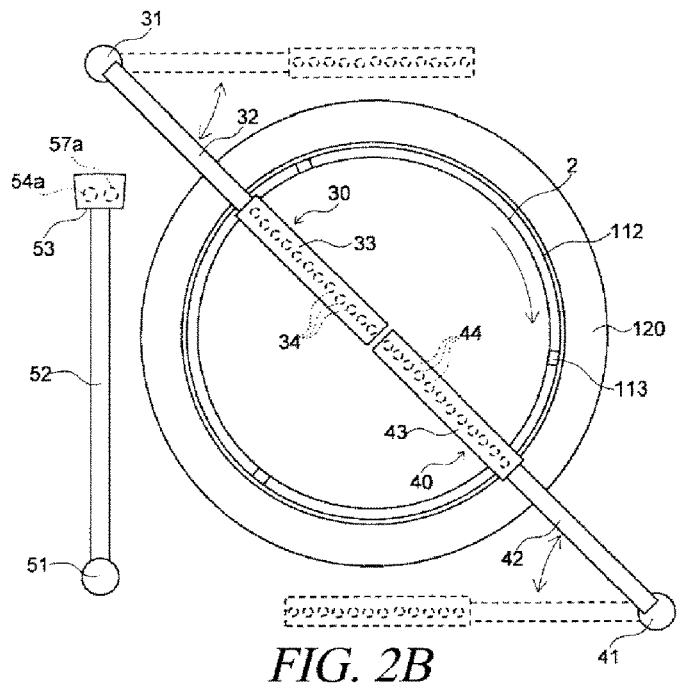
FIG. 2A and FIG. 2B are plane views of the plating apparatus illustrated in FIG. 1.
Figure 2B:
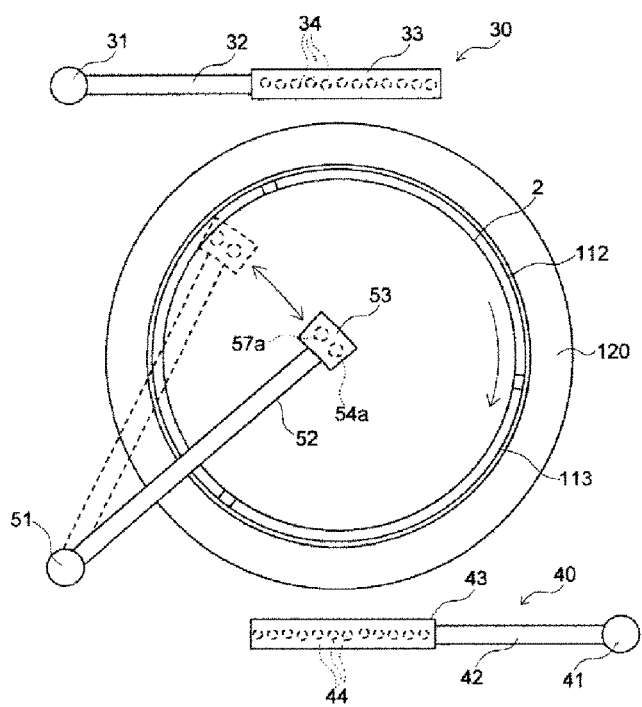

Hereinafter, referring to FIG. 1 to FIG. 7, a first example embodiment will be explained. Referring to FIG. 1, FIG. 2A and FIG. 2B, an overall configuration of a plating apparatus 20 will be explained first. FIG. 1 is a side view illustrating the plating apparatus 20, and FIG. 2A and FIG. 2B are plane views of the plating apparatus 20. Further, in the present example embodiment, there will be explained an example where the plating apparatus 20 is a single-substrate processing apparatus that performs a plating process to a single substrate 2 by discharging a plating liquid to the substrate 2.

Plating Apparatus

The plating apparatus 20 includes a substrate holding unit 110 configured to hold and rotate the substrate 2 within a casing 101; a plating unit configured to discharge a plating liquid toward the substrate 2 held by the substrate holding unit 110 and form a plating layer having a specific function on an inner surface of a recess in the substrate; and a plating liquid supply unit connected to the plating unit and configured to supply the plating liquid to the plating unit. Further, the plating unit includes a first plating unit 30 configured to discharge a first plating liquid toward the substrate 2 and a second plating unit 40 configured to discharge a second plating liquid toward the substrate 2. Further, the plating liquid supply unit includes a first plating liquid supply unit 71 configured to supply the first plating liquid to the first plating unit 30 and a second plating liquid supply unit 72 configured to supply the second plating liquid to the second plating unit 40. Details of the first plating liquid and the second plating liquid will be described later.

Furthermore, the plating apparatus 20 further includes a first pre-treatment unit 54 configured to discharge a first pre-treatment liquid toward the substrate 2. The first pre-treatment unit 54 is connected to a first pre-treatment liquid supply unit 73 configured to supply the first pre-treatment liquid to the first pre-treatment unit 54. The first pre-treatment liquid is discharged toward the substrate 2 before the first plating liquid or the second plating liquid is discharged toward the substrate 2. As the first pre-treatment liquid, for example, deionized pure water, so-called deionized water (DIW), may be used.

Moreover, the plating apparatus 20 may further include a pre-wet unit 57 configured to discharge a pre-wet liquid toward the substrate 2. The pre-wet unit 57 is connected to a pre-wet liquid supply unit 76 configured to supply the pre-wet liquid to the pre-wet unit 57. The pre-wet liquid is a liquid to be supplied toward the substrate 2 in a dry state. With the pre-wet liquid, for example, affinity between a processing liquid to be subsequently supplied toward the substrate 2 and the substrate 2 can be increased. As the pre-wet liquid, ionized water containing ions of $CO_2$ may be used.

Around the substrate holding unit 110, a liquid drain cup 120 including a first opening portion 121 and a second opening portion 126 and configured to receive a liquid such as the plating liquid or the first pre-treatment liquid scattered from the substrate 2 and an exhaust cup 105 including an opening portion 106 for sucking a gas are arranged. Liquids received by the first opening portion 121 and the second opening portion 126 of the liquid drain cup 120 are drained out by a first liquid drain unit 122 and a second liquid drain unit 127. A gas sucked from the opening portion 106 of the exhaust cup 105 is exhausted by an exhaust unit 107. Further, the liquid drain cup 120 is connected to an elevation unit 164, and the elevation unit 164 can move the liquid drain cup 120 up and down. For this reason, the liquid drain cup 120 can be moved up and down according to a kind of a liquid scattered from the substrate 2, so that a path through which the liquid is drained out can be different for each kind of a liquid.

(Substrate Holding Unit)

As depicted in FIG. 1, the substrate holding unit 110 includes a hollow cylindrical rotation shaft 111 vertically extended within the casing 101, a turn table 112 provided at an upper end of the rotation shaft 111, a wafer chuck 113 provided at an outer periphery of an upper surface of the turn table 112 and configured to support the substrate 2, and a rotation unit 162 connected to the rotation shaft 111 and configured to rotate and drive the rotation shaft 111.

The rotation unit 162 is controlled by a control unit 160 to rotate and drive the rotation shaft 111. Thus, the substrate 2 supported by the wafer chuck 113 is rotated. In this case, the control unit 160 controls the rotation unit 162, so that the rotation shaft 111 and the wafer chuck 113 can be rotated or the rotation thereof stopped. Further, the control unit 160 can increase or decrease the rotation number of the rotation shaft 111 and the wafer chuck 113, or can control the rotation number to be maintained at a certain value.

(Plating Unit)

Hereinafter, the first plating unit 30 and the second plating unit 40 will be explained. The first plating unit 30 and the second plating unit 40 are different from each other only in composition of plating liquids to be discharged toward the substrate 2 and have substantially the same configuration except such a difference. Herein, the first plating unit 30 will be mainly explained.

The first plating unit 30 includes a discharge nozzle 34 configured to discharge the first plating liquid toward the substrate 2 and a discharge head 33 in which the discharge nozzle 34 is provided. Within the discharge head 33, a line through which the first plating liquid supplied from the first plating liquid supply unit 71 is introduced into the discharge nozzle 34 and a line through which a heat transfer medium for keeping heat of the first plating liquid is circulated are accommodated.

The discharge head 33 is configured to be vertically and horizontally moved. By way of example, the discharge head 33 is provided at a front end of an arm 32, and the arm 32 is fixed at a supporting shaft 31 which can be vertically extended and can be rotated and driven by a rotation unit 165. As depicted in FIG. 2A, with the rotation unit 165 and the supporting shaft 31, the discharge head 33 can be moved between a discharge position where the discharge head 33 discharges the first plating liquid toward the substrate 2 and a stand-by position where the discharge head 33 does not discharge the first plating liquid.

As depicted in FIG. 1, the discharge head 33 may be extended to have a length corresponding to a length from a central portion of the substrate 2 to a peripheral portion of the substrate 2, i.e. the radius of the substrate 2. In this case, in the discharge head 33, there may be provided multiple discharge nozzles 34 configured to discharge the first plating liquid. In this case, when the first plating liquid is discharged, the discharge head 33 is positioned such that the multiple discharge nozzles 34 are arranged along a radial direction of the substrate 2, and, thus, it is possible to supply the first plating liquid throughout a wide area of the substrate 2 at the same time.

The second plating unit 40 includes a discharge head 44 configured to discharge the second plating liquid toward the substrate 2 and a discharge head 43 in which the discharge head 44 is provided. Further, the discharge head 43 is provided at a front end of an arm 42. The arm 42 is fixed at a supporting shaft 41 which can be vertically extended and can be rotated and driven by a rotation unit 167.

(Plating Liquid Supply Unit)

Hereinafter, referring to FIG. 3, there will be explained the plating liquid supply units 71 and 72 configured to supply plating liquids to the plating units 30 and 40, respectively. Further, the first plating liquid supply unit 71 and the second plating liquid supply unit 72 are different from each other only in composition of the plating liquids accommodated therein and have substantially the same configuration except such a difference. Herein, the first plating liquid supply unit 71 will be mainly explained.

Figure 3:
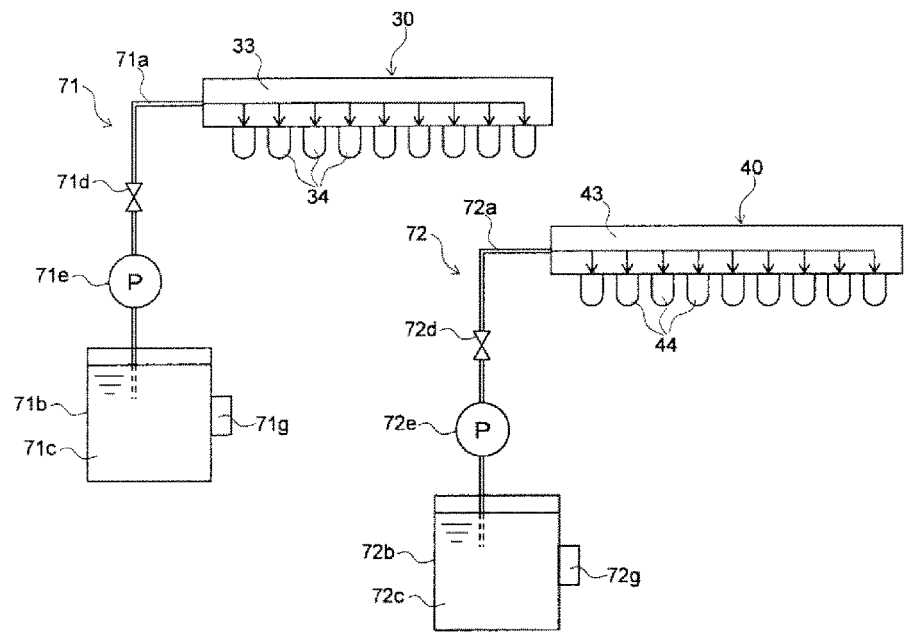
FIG. 3 is a diagram illustrating a plating liquid supply unit configured to supply a plating liquid to a plating unit.

As depicted in FIG. 3, the first plating liquid supply unit 71 includes a tank 71b configured to store a first plating liquid 71c; and a supply line 71a configured to supply the first plating liquid 71c within the tank 71b to the first plating unit 30. The supply line 71a includes a valve 71d and a pump 71e configured to control a flow rate of the first plating liquid 71c. Further, in the tank 71b, there is provided a heating unit 71g configured to heat the first plating liquid 71c stored in the tank 71b. Likewise, the second plating liquid supply unit 72 includes a supply line 72a, a tank 72b, a valve 72d, a pump 72e, and a heating unit 72g.

In the present example embodiment, as described below, a plating process is performed to an inner surface of a recess which is formed in the substrate and has a high aspect ratio. Further, a depth of the recess is remarkably increased as compared with a depth of the conventional recess, and it is, for example, 10 μm or more. If a plating liquid is supplied to such a deep recess, each component contained in the plating liquid reaches to the bottom of the recess based on mainly diffusion in the plating liquid. Diffusion is a phenomenon that gradually proceeds as times passes. For this reason, a concentration distribution of each component of the plating liquid within the recess changes over time as a plating layer is formed by a plating reaction. Therefore, if a plating liquid is supplied to a deep recess, generally, a concentration distribution of each component of the plating liquid within the recess becomes non-uniform. For this reason, it can be assumed that if a single plating liquid is supplied to the recess, a thickness of a plating layer to be formed on the inner surface of the recess may vary depending on positions within the recess.

In accordance with the present example embodiment, when a plating layer having a specific function is formed on the inner surface of the recess, two kinds of plating liquids having different compositions are used to solve the above-described problem. Hereinafter, the first plating liquid and the second plating liquid used in the present example embodiment will be explained.

(Plating Liquid)

The first plating liquid and the second plating liquid contain materials corresponding to the plating layer formed on the surface of the substrate 2 and having a specific function. By way of example, if the plating layer formed on the substrate 2 by the plating apparatus 20 is a barrier film configured to suppress a metal material constituting a wiring from being transmitted into an insulating film or the substrate 2, the first plating liquid and the second plating liquid include Co (cobalt), W (tungsten), or Ta (tantalum) to be used as a material of the barrier film. Further, if the plating layer formed on the substrate 2 by the plating apparatus 20 is a seed film configured to easily bury a wiring material, the first plating liquid and the second plating liquid includes Cu (copper) to be used as a wiring material. In addition, the first plating liquid and the second plating liquid may contain a complexing agent or a reducing agent (a compound containing B (boron) and P (phosphor)), and a surfactant depending on a material contained therein or a kind of a plating reaction.

Further, at least one of the first plating liquid and the second plating liquid may contain an additive which can affect a plating reaction rate. The additive can be appropriately selected depending on a material contained in the plating liquid. By way of example, if the first plating liquid and the second plating liquid contain Co and W to be used as a material of the barrier film, at least one of the first plating liquid and the second plating liquid may contain bis(3-sulfopropyl)disulfide, so-called SPS, as the additive.

Hereinafter, the reason why the additive is added to the plating liquid will be explained in detail. In the present example embodiment, a concentration of the additive contained in the first plating liquid is different from a concentration of the additive contained in the second plating liquid. By way of example, if SPS is used as the additive, a concentration of SPS contained in the first plating liquid is set to be lower than a concentration of SPS contained in the second plating liquid. To be specific, a concentration of SPS contained in the second plating liquid is set to 5 ppm or more, and a concentration of SPS contained in the first plating liquid is set to less than 5 ppm, for example, 0 ppm. Thus, it is possible to improve uniformity in thickness of the plating layer including a first plating layer formed of the first plating liquid and a second plating layer formed of the second plating liquid.

Hereinafter, there will be explained a mechanism in which the uniformity in thickness of the plating layer can be improved by using two kinds of plating liquids having different additive concentrations.

The present inventors have repeated the experiment and found that in a plating process to a recess having a large depth, a portion of an inner surface of the recess where a plating layer is likely to be formed is changed depending on a concentration of the additive, which is supported by an experimental result from an experimental example to be described later. By way of example, in the case of using a plating liquid which does not contain SPS, a plating layer is formed first on an upper portion of the inner surface of the recess. On the other hand, in the case of using a plating liquid which contains SPS, a plating layer is formed first on a lower portion of the inner surface of the recess. As such, there may be various reasons why a position where a plating layer is formed first is changed depending on a concentration of the additive. By way of example, one of the reasons may be that in the plating liquid, a diffusion rate of an element to be a material of the plating layer is different from a diffusion rate of the additive.

Based on this finding, in the present example embodiment, a concentration of the additive in the first plating liquid is set such that a rate of a plating reaction on the upper portion of the recess in the substrate is higher than a rate of a plating reaction at the lower portion of the recess. Further, a concentration of the additive in the second plating liquid is set such that a rate of a plating reaction at the lower portion of the recess in the substrate is higher than a rate of a plating reaction on the upper portion of the recess. Since a single plating layer having a specific function such as a barrier film or a seed film is formed by using such two kinds of plating liquids, it is possible to improve uniformity in thickness of the plating layer formed on the inner surface of the recess, as described later.

(First Pre-Treatment Unit and Pre-Wet Unit)

Hereinafter, the first pre-treatment unit 54 and the pre-wet unit 57 will be explained. The first pre-treatment unit 54 includes a discharge head 54a configured to discharge a first pre-treatment liquid toward the substrate 2. In the same manner, the pre-wet unit 57 includes a discharge head 57a configured to discharge a pre-wet liquid toward the substrate 2. As depicted in FIG. 1, each of the discharge heads 54a and 57a may be provided in the discharge head 53. The discharge head 53 can be vertically and horizontally moved. By way of example, in the same manner as the discharge head 33 of the first plating unit 30, the discharge head 53 of the first pre-treatment unit 54 is provided at a front end of an arm 52. The arm 52 is fixed at a supporting shaft 51 which can be vertically extended and be rotated by a rotation unit 166. In this case, as depicted in FIG. 2B, the discharge head 53 can be horizontally rotated about an axis of the supporting shaft 51 between a position corresponding to the central portion of the substrate 2 and a position corresponding to the peripheral portion of the substrate 2.

(First Pre-Treatment Supply Unit and Pre-Wet Liquid Supply Unit)

Hereinafter, referring to FIG. 4, there will be explained the first pre-treatment liquid supply unit 73 configured to supply the first pre-treatment liquid to the first pre-treatment unit 54 and the pre-wet liquid supply unit 76 configured to supply the pre-wet liquid toward the pre-wet unit 57. Further, the first pre-treatment liquid supply unit 73 and the pre-wet liquid supply unit 76 are different from each other only in a kind of a processing liquid accommodated therein and have substantially the same configuration except such a difference. Herein, the first pre-treatment liquid supply unit 73 will be mainly explained.

Figure 4:
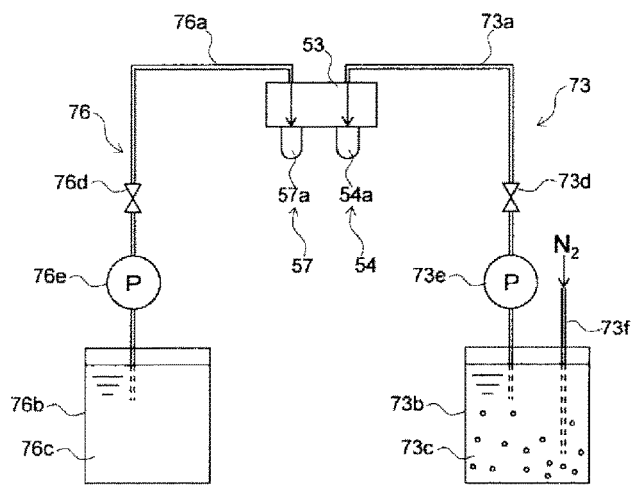
FIG. 4 is a diagram illustrating a first pre-treatment liquid supply unit configured to supply a first pre-treatment liquid to a first pre-treatment unit.

As depicted in FIG. 4, the first pre-treatment liquid supply unit 73 includes a tank 73b configured to store a first pre-treatment liquid 73c such as DIW; and a supply line 73a configured to supply the first pre-treatment liquid 73c within the tank 73b to the first pre-treatment unit 54. The supply line 73a includes a valve 73d and a pump 73e configured to control a flow rate of the first pre-treatment liquid 73c. Further, the first pre-treatment liquid supply unit 73 may further include a deaeration device 73f configured to remove a gas such as dissolved oxygen or dissolved hydrogen in the first pre-treatment liquid 73c. As depicted in FIG. 4, the deaeration device 73f may be configured as a gas supply line for supplying an inert gas such as nitrogen gas to the first pre-treatment liquid 73c stored in the tank 73b. Thus, the inert gas can be dissolved in the first pre-treatment liquid 73c, so that oxygen or hydrogen already dissolved in the first pre-treatment liquid 73c can be discharged to the outside. That is, a deaeration process can be performed to the first pre-treatment liquid 73c.

The plating apparatus 20 configured as described above is controlled by a control unit 160 according to various programs recorded in a storage medium 161 provided in the control unit 160. Thus, various processes are performed to the substrate 2. Herein, the storage medium 161 stores various setting data or various programs such as a plating process program to be described later. As the storage medium 161, a publicly known storage medium such as a computer-readable memory, e.g., a ROM or a RAM, or a hard disc, a disc-shaped storage medium, e.g., a CD-ROM, a DVD-ROM, or a flexible disc may be used.

Plating Method

Figure 5:
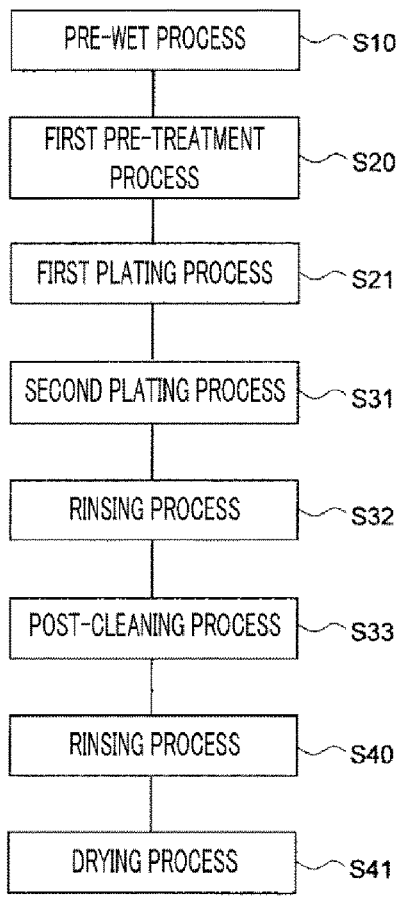
FIG. 5 is a flowchart showing a plating method in accordance with the first example embodiment.

Hereinafter, an operation and an effect of the present example embodiment configured as described above will be explained. There will be explained a plating method of forming a barrier film containing CoWB by an electroless plating process on an inner surface of the recess 12 formed in the substrate 2. FIG. 5 is a flowchart showing a plating method. Further, FIG. 6A to FIG. 6F are cross-sectional views illustrating the substrate 2 in the respective processes of the plating method.

Firstly, the recess 12 for burying a wiring material is formed in the substrate 2. As a method of forming the recess 12 in the substrate 2, one of the conventionally known methods may be appropriately employed. To be specific, for example, as a dry etching technique, a general-purpose technique using a fluorine-based or chlorine-based gas may be employed. In particular, in order to form the recess 12 having a high aspect ratio (ratio of a depth of a hole to a diameter thereof), a method using an ICP-RIE (Inductively Coupled Plasma Reactive Ion Etching) technique capable of deep-etching at a high speed may be employed more appropriately. In particular, a so-called Bosch process in which an etching process using a sulphur hexafluoride gas and a protection process using a Teflon-based gas such as $C_4F_8$ are repeatedly performed may be appropriately employed.

A shape of the recess 12 is not particularly limited as long as a movement of each component of the plating liquid within the recess 12 is based on mainly the diffusion instead of on the flow. By way of example, an aspect ratio of the recess 12 is in a range of 5 to 30. To be specific, if a horizontal cross section of the recess has a circular shape, a diameter of the recess 12 is in a range of 0.5 μm to 20 μm, for example, 8 μm. Further, a height or depth of the recess 12 is in a range of 10 μm to 250 μm, for example, 100 μm. Then, an insulating film is formed within the recess 12. As a method of forming the insulating film, for example, a method of forming a silicon oxide film ($SiO_2$) by a CVD (Chemical Vapor Deposition) method is used.

Then, the substrate 2 is prepared within the casing 101. In the pre-wet unit 57, a pre-wet liquid is discharged toward the substrate 2 (Pre-wet process (S10)). Thus, affinity between the surface of the substrate 2, for example, the inner surface of the recess 12 and the upper surface of the substrate 2, and the pre-treatment liquid to be supplied to the substrate 2 can be increased. As the pre-wet liquid, for example, ionized water containing ions of $CO_2$ may be used.

Figure 6A:
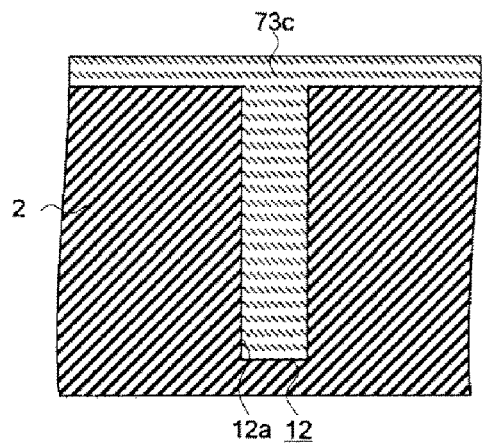
FIG. 6A is a diagram illustrating a process of preparing a substrate in which a recess is formed.

Then, in the first pre-treatment unit 54, the first pre-treatment liquid 73c is discharged toward the substrate 2 (First pre-treatment process (S20)). Thus, as depicted in FIG. 6A, the inside of the recess 12 is filled with the first pre-treatment liquid 73c. As the first pre-treatment liquid 73c, for example, DIW to which a deaeration process is performed may be used.

Figure 7:
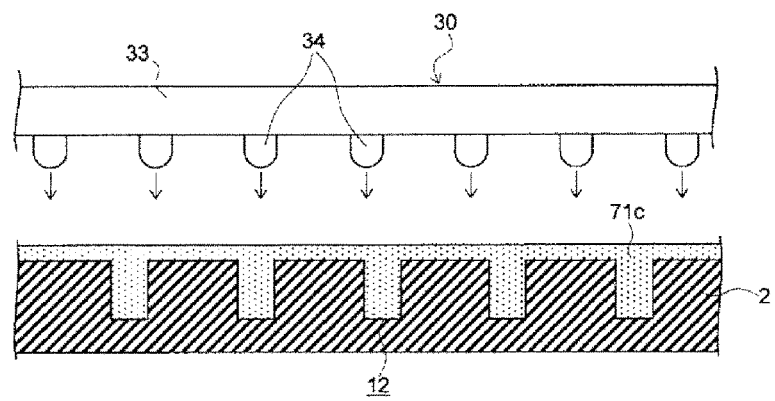
FIG. 7 is a diagram illustrating that multiple discharge nozzles supply the plating liquid to the substrate.

Thereafter, in the plating unit 30, the plating liquid 71c of forming a film of CoWB is discharged toward the substrate 2 (First plating process (S21)). To be specific, in the first plating liquid supply unit 71, the first plating liquid 71c heated to a preset temperature is supplied to the first plating unit 30. The supplied first plating liquid 71c has a temperature, for example, 45° C., at which a plating reaction can proceed at an appropriate rate. Then, as depicted in FIG. 7, the first plating liquid 71c is discharged toward the substrate 2 from the multiple discharge nozzles 34 arranged in parallel with each other along the radial direction of the substrate 2. Thus, it is possible to supply the first plating liquid 71c throughout a wide area of the substrate 2 at the same time. Thus, a temperature distribution of the first plating liquid 71c on the substrate 2 can be substantially uniform regardless of positions on the substrate 2. By way of example, a temperature of the first plating liquid 71c reaching the central portion of the substrate 2 can be substantially equal to a temperature of the first plating liquid 71c reaching the peripheral portion of the substrate 2.

Figure 6B:
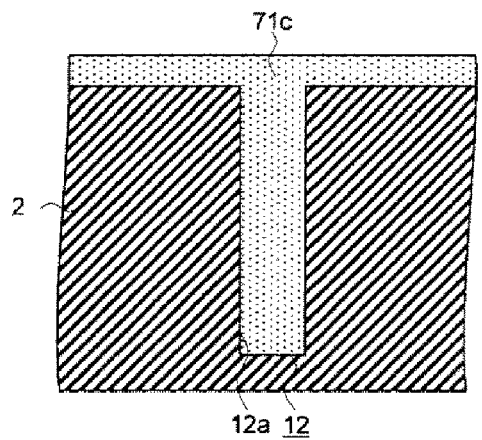
FIG. 6B is a diagram illustrating a process of supplying a first plating liquid.
Figure 6C:
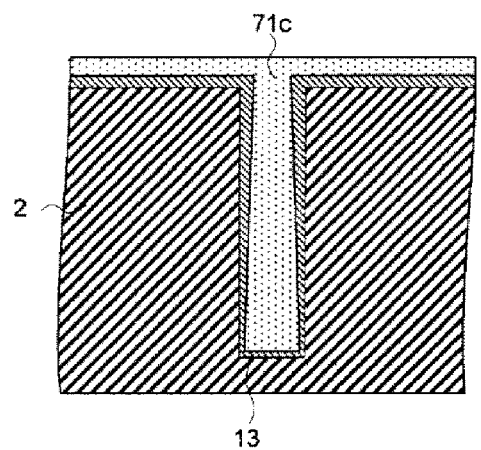
FIG. 6C is a diagram illustrating that a first plating layer is formed on an inner surface of the recess.

If the first plating liquid 71c is discharged toward the substrate 2, as depicted in FIG. 6B, the first pre-treatment liquid 73c within the recess 12 is substituted with the first plating liquid 71c, and the inside of the recess 12 is filled with the first plating liquid 71c. At this time, a plating reaction in the first plating liquid 71c is carried out. As a result, as depicted in FIG. 6C, a first plating layer 13 is formed on an inner surface 12a of the recess 12. However, as described above, each component contained in the first plating liquid 71c reaches to the bottom of the recess 12 based on mainly diffusion in the plating liquid. For this reason, a concentration distribution of each component in the first plating liquid 71c within the recess 12 is generally non-uniform between the upper portion of the recess 12 and the lower portion thereof as the plating reaction proceeds. Further, a concentration of SPS contained in the first plating liquid 71c is lower than a concentration of SPS contained in a second plating liquid 72c, and it is, for example, 0 ppm. For this reason, in the first plating process (S21), the first plating layer 13 is formed first on the upper portion of the recess 12. That is, as depicted in FIG. 6C, a thickness of the first plating layer 13 formed on the inner surface 12a of the recess 12 is greater at the upper portion of the recess 12 than at the lower portion of the recess 12.

Then, in the second plating unit 40, the second plating liquid 71c of forming a film of CoWB is discharged toward the substrate 2 (Second plating process (S31)). To be specific, in the second plating liquid supply unit 72, the second plating liquid 72c heated to a preset temperature is discharged to the second plating unit 40. The supplied second plating liquid 72c has a temperature, for example, 45° C., at which a plating reaction can proceed at an appropriate rate. Then, in the same manner as the first plating process (S21), the second plating liquid 72c is discharged toward the substrate 2 from the multiple discharge nozzles 44 arranged in parallel with each other along the radial direction of the substrate 2. Thus, it is possible to supply the second plating liquid 72c throughout a wide area of the substrate 2 at the same time. Thus, a temperature distribution of the second plating liquid 72c on the substrate 2 can be substantially uniform regardless of positions on the substrate 2. By way of example, a temperature of the second plating liquid 72c reaching the central portion of the substrate 2 can be substantially equal to a temperature of the second plating liquid 72c reaching the peripheral portion of the substrate 2.

Figure 6D:
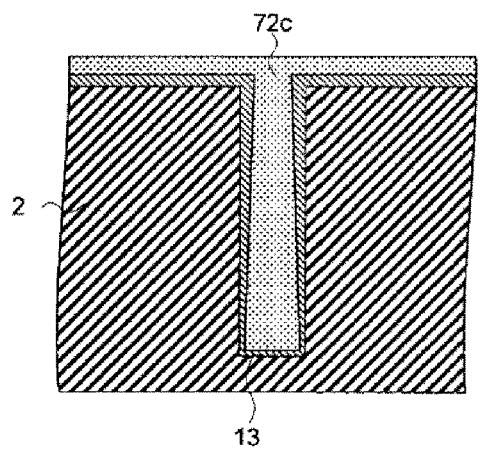
FIG. 6D is a diagram illustrating a process of supplying a second plating liquid.
Figure 6E:
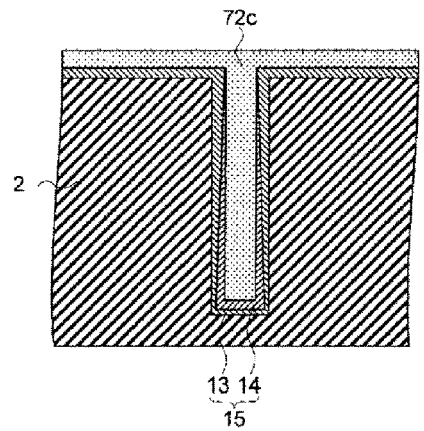
FIG. 6E is a diagram illustrating that a second plating layer is formed on the first plating layer.

If the second plating liquid 72c is discharged toward the substrate 2, as depicted in FIG. 6D, the first plating liquid 71c within the recess 12 is substituted with the second plating liquid 72c, and the inside of the recess 12 is filled with the second plating liquid 72c. At this time, a plating reaction in the second plating liquid 72c is carried out. As a result, as depicted in FIG. 6E, a second plating layer 14 is formed on the first plating layer 13. However, in the same manner as the first plating liquid 71c, each component contained in the second plating liquid 72c reaches to the bottom of the recess 12 based on mainly diffusion in the plating liquid. For this reason, a concentration distribution of each component in the second plating liquid 72c within the recess 12 is generally non-uniform. Further, the concentration of SPS contained in the second plating liquid 72c is higher than the concentration of SPS contained in the first plating liquid 71c, and it is, for example, 5 ppm. For this reason, in the second plating process (S31), the second plating layer 14 is formed first on the lower portion of the recess 12. That is, as depicted in FIG. 6E, a thickness of the second plating layer 14 formed on the inner surface 12a of the recess 12 is greater at the lower portion of the recess 12 than at the upper portion of the recess 12.

As such, in accordance with the present example embodiment, in the first plating process (S21), the first plating layer 13 is formed first on the upper portion of the recess 12, and in the second plating process (S31), the second plating layer 14 is formed first on the lower portion of the recess 12. For this reason, a thickness of the barrier film formed of the plating layer 15 including the first plating layer 13 and the second plating layer 14 can be substantially uniform regardless of positions within the recess 12. Further, a time for the first plating process (S21) and a time for the second plating process (S31) are appropriately adjusted such that the thickness of the plating layer 15 can be substantially uniform regardless of the positions within the recess 12 and the overall thickness of the plating layer 15 can have a desired level.

Then, post-treatments including rinsing processes (S32 and S40) of discharging a rinse toward the substrate 2, a post-cleaning process (S33) of discharging a post-cleaning liquid toward the substrate 2, and a drying process (S41) of drying the substrate 2 with air or IPA are carried out. As such, the substrate 2 on which a barrier film of the plating layer 15 is formed can be obtained.

Figure 6F:
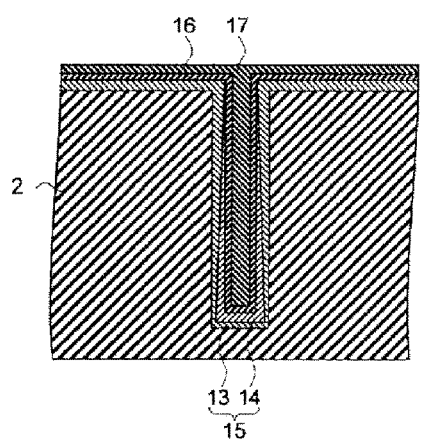
FIG. 6F is a diagram illustrating a process of burying a wiring material into the recess.

Then, as depicted in FIG. 6F, a seed film 16 may be formed on the barrier film of the plating layer 15. Further, a wiring 17 including a metal material such as copper may be formed within the recess 12 covered with the seed film 16. A method of forming the seed film 16 and the wiring 17 is not particularly limited, but, for example, an electroless plating method may be used. Herein, in the same manner as the case of forming the barrier film of the plating layer 15, two kinds of plating liquids different in concentration of an additive contained therein may be used.

In accordance with the present example embodiment, as described above, the plating layer 15 having a specific function is formed on the inner surface 12a of the recess 12 by using two kinds of the plating liquids 71c and 72c which are different in concentrations of the additives contained therein. In this case, by appropriately adjusting a concentration of the additive contained in each of the plating liquids 71c and 72c, it is possible to achieve an appropriate balance between the plating reaction rate when using the first plating liquid 71c and the plating reaction rate when using the second plating liquid 72c. By way of example, each plating reaction rate can be adjusted such that a thickness of the plating layer 15 can be substantially uniform regardless of the positions within the recess 12. Thus, uniformity in thickness of the plating layer 15 can be easily improved as compared with the case of forming the plating layer 15 using only one kind of a plating liquid.

Further, in accordance with the present example embodiment, as described above, there is used DIW, to which the deaeration process is performed, as the first pre-treatment liquid 73c to be supplied to the substrate 2 in the first pre-treatment process. For this reason, it is possible to suppress bubbles caused by the dissolved gas in the first pre-treatment liquid 73c from being formed on the surface of the substrate 2 including the inner surface 12a of the recess 12. Thus, a plating reaction can efficiently proceed on the surface of the substrate 2 without being affected by the bubbles, so that the plating layer 15 can be formed on the surface of the substrate 2 uniformly.

Furthermore, in accordance with the present example embodiment, as described above, the ionized water containing ions of $CO_2$ is used as the pre-wet liquid to be supplied to the substrate 2 in the pre-wet process. For this reason, as compared with the case where an electrically neutral processing liquid such as DIW is supplied to the substrate 2 in advance, it is possible to suppress electric discharge from occurring during the plating process.

Moreover, in accordance with the present example embodiment, as described above, the plating liquids 71c and 72c are discharged toward the substrate 2 from the multiple discharge nozzles 34 and 44 arranged in parallel with each other along the radial direction of the substrate 2, respectively. For this reason, temperature distributions of the plating liquids 71c and 72c on the substrate 2 can be substantially uniform regardless of positions on the substrate 2. Thus, a thickness of the plating layer 15 formed on the substrate 2 can be uniform regardless of the positions on the substrate 2.

Modification Example

Figure 8:
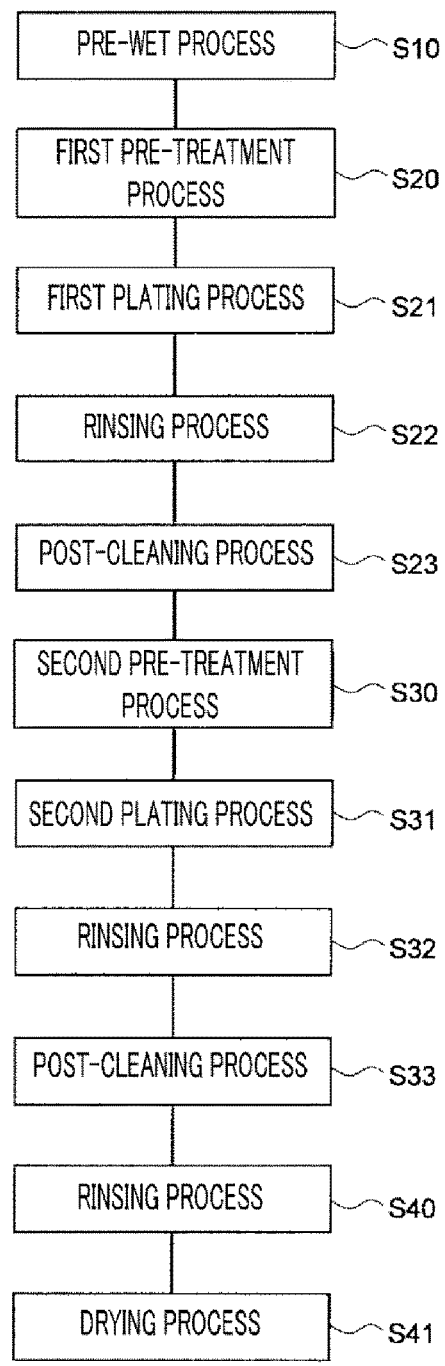
FIG. 8 is a flowchart showing a plating method in accordance with a modification example of the first example embodiment.

Further, in the present example embodiment, a concentration of the additive in the first plating liquid 71c is set such that the plating reaction rate on the upper portion of the recess 12 formed in the substrate 2 is higher than the plating reaction rate on the lower portion of the recess 12, and a concentration of the additive in the second plating liquid 72c is set such that the plating reaction rate on the lower portion of the recess 12 in the substrate 2 is higher than the plating reaction rate on the upper portion of the recess 12. However, the present example embodiment is not limited thereto, and a concentration of the additive in the first plating liquid 71c may be set such that the plating reaction rate on the lower portion of the recess 12 in the substrate 2 is higher than the plating reaction rate on the upper portion of the recess 12, and a concentration of the additive in the second plating liquid 72c may be set such that the plating reaction rate on the upper portion of the recess 12 in the substrate 2 is higher than the plating reaction rate on the lower portion of the recess 12. By way of example, a concentration of SPS contained in the first plating liquid 71c may be set to be higher than a concentration of SPS contained in the second plating liquid 72c. Even in this case, the plating layer 15 is configured as a stacked layer including the first plating layer 13 formed of the first plating liquid 71c and the second plating layer 14 formed of the second plating liquid 72c. For this reason, a thickness of the plating layer 15 can be substantially uniform regardless of positions within the recess. Furthermore, in the present modification example, as depicted in FIG. 8, a second pre-treatment liquid is supplied to the substrate 2, and, thus, a second pre-treatment process (S30) of filling the inside of the recess 12 with the second pre-treatment liquid may be performed between the first plating process (S21) and the second plating process (S31). By performing the second pre-treatment process (S30), the first plating liquid 71c filled in the recess 12 can be removed. As a result, it is possible to set a concentration of SPS in the plating liquid during the second plating process (S31) to be lower than a concentration of SPS in the plating liquid during the first plating process (S21). The second pre-treatment liquid used in the second pre-treatment process (S30) is substantially the same as the first pre-treatment liquid 73c used in the first pre-treatment process (S20). Further, a second pre-treatment unit configured to supply the second pre-treatment liquid to the substrate is substantially the same as the first pre-treatment unit 54 used in the first pre-treatment process (S20). Furthermore, the first pre-treatment unit and the second pre-treatment unit may be provided separately or may be commonly provided as a single pre-treatment unit.

Further, as depicted in FIG. 8, a rinsing process (S22) of discharging a rinse liquid toward the substrate 2 or a post-cleaning process (S23) of discharging a post-cleaning liquid toward the substrate 2 may be further performed between the first plating process (S21) and the second plating process (S31).

The present example embodiment illustrates an example where the heating units 71g and 72g configured to heat the plating liquids 71c and 72c to be supplied to the plating units 30 and 40 are provided at the tanks 71b and 72b, respectively. However, an aspect for heating the plating liquids 71c and 72c is not limited thereto. By way of example, the heating units 71g and 72g may be respectively provided at the supply lines 71a and 72a instead of the tanks 71b and 72b.

Second Example Embodiment

Referring to FIG. 9 to FIG. 13, a second example embodiment will be explained. In the second example embodiment depicted in FIG. 9 to FIG. 13, each of the first plating process and the second plating process includes a substitution process performed at a low temperature and a film forming process performed at a high temperature. In the second example embodiment depicted in FIG. 9 to FIG. 13, the same configurations as the first example embodiment and the modification example depicted in FIG. 1 to FIG. 8 are assigned the same reference numerals, and detailed explanation thereof will be omitted.

Plating Apparatus

Figure 9:
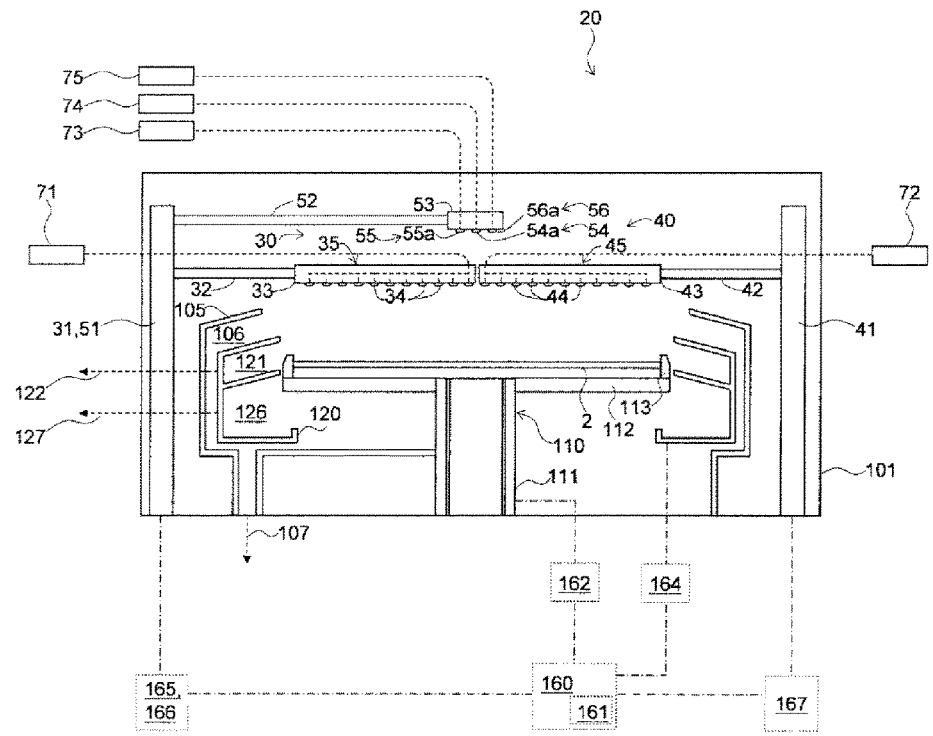
FIG. 9 is a side view illustrating a plating apparatus in accordance with a second example embodiment.
Figure 10:
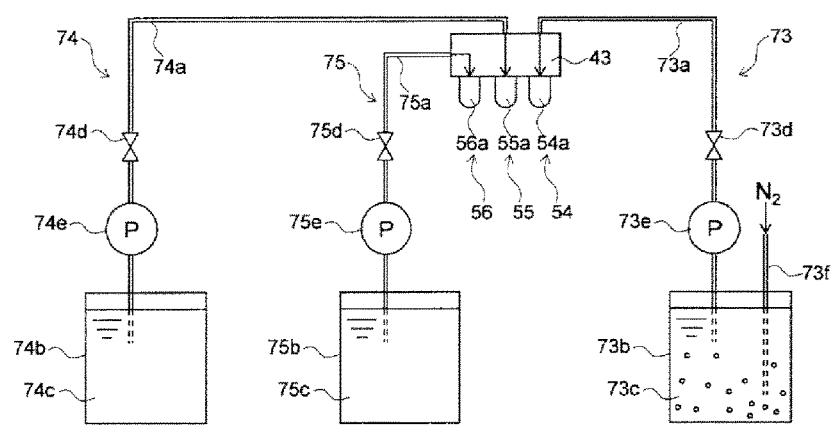
FIG. 10 is a diagram illustrating plating liquid supply units configured to respectively supply plating liquids to substitution units.

Referring to FIG. 9 and FIG. 10, a plating apparatus 20 used in the second example embodiment will be explained first. FIG. 9 is a side view illustrating the plating apparatus 20, and FIG. 10 is a diagram illustrating plating liquid supply units 74 and 75 configured to respectively supply plating liquids to substitution units 55 and 56 to be described later. Hereinafter, referring to FIG. 9 and FIG. 10, the plating units 30 and 40 in the present example embodiment will be explained. Further, the first plating unit 30 and the second plating unit 40 are different from each other only in composition of the plating liquids to be discharged toward the substrate 2 and have substantially the same configuration except such a difference. Herein, the first plating unit 30 will be mainly explained.

First Plating Unit

The first plating unit 30 includes a first substitution unit 55 configured to discharge a low-temperature first plating liquid toward the substrate 2; and a first film forming unit 35 configured to discharge a high-temperature first plating liquid, which has a temperature higher than that of the first plating liquid used in the first substitution unit 55, toward the substrate 2. Further, the term "low temperature" means that a plating reaction cannot proceed actively at the temperature of the first plating liquid discharged from the first substitution unit 55. By way of example, it means that a film forming rate of a first plating layer 13 formed of the first plating liquid discharged from the first substitution unit 55 has 10% or less of a film forming rate of a first plating layer 13 finally formed of the high-temperature plating liquid. Further, the term "high temperature" means that a plating process can be completed within an allowable processing time at a temperature of the first plating liquid discharged from the first film forming unit 35.

As depicted in FIG. 9, the first film forming unit 35 includes multiple discharge nozzles 34 configured to discharge the first plating liquid toward the substrate 2. Further, the first film forming unit 35 is connected to a first film forming plating liquid supply unit 71 configured to supply the high-temperature first plating liquid to the first film forming unit 35. Each discharge nozzle 34 and the first film forming plating liquid supply unit 71 are substantially the same as each discharge nozzle 34 and the first plating liquid supply unit 71 of the first example embodiment, respectively.

Further, as depicted in FIG. 9, the first substitution unit 55 is provided in the discharge head 53 and includes a discharge nozzle 55a configured to discharge the low-temperature first plating liquid toward the substrate 2. Furthermore, the first substitution unit 55 is connected to a first substitution plating liquid supply unit 74 configured to supply the low-temperature first plating liquid to the first substitution unit 55.

As depicted in FIG. 10, the first substitution plating liquid supply unit 74 includes a tank 74b configured to store a low-temperature, for example, room-temperature first plating liquid 74c; and a supply line 74a configured to supply the first plating liquid 74c stored in the tank 74b to the first substitution unit 55. The supply line 74a includes a valve 74d and a pump 74e configured to control a flow rate of the first plating liquid 74c. Further, the first plating liquid 74c supplied from the first substitution plating liquid supply unit 74 is substantially same as the first plating liquid 71c supplied from the first film forming plating liquid supply unit 71 except a temperature thereof.

Second Plating Unit

The second plating unit 40 includes a second substitution unit 56 configured to discharge a low-temperature second plating liquid toward the substrate 2; and a second film forming unit 45 configured to discharge a high-temperature second plating liquid toward the substrate 2. Further, the terms "low temperature" and "high temperature" have the same meanings as those in the above-described first plating unit 30, and, thus, detailed explanation thereof will be omitted.

As depicted in FIG. 9, the second film forming unit 45 includes multiple discharge nozzles 44 configured to discharge the second plating liquid toward the substrate 2. Further, the second film forming unit 45 is connected to a second film forming plating liquid supply unit 72 configured to supply the high-temperature second plating liquid to the second film forming unit 45. Further, the second substitution unit 56 is provided in the discharge head 53 and includes a discharge nozzle 56a configured to discharge the low-temperature second plating liquid toward the substrate 2. Furthermore, the second substitution unit 56 is connected to a second substitution plating liquid supply unit 75 configured to supply the low-temperature second plating liquid to the second substitution unit 56.

As depicted in FIG. 10, the second substitution plating liquid supply unit 75 includes a tank 75b configured to store a low-temperature, for example, room-temperature second plating liquid 75c; and a supply line 75a configured to supply the second plating liquid 75c stored in the tank 75b to the second substitution unit 56. The supply line 75a includes a valve 75d and a pump 75e configured to control a flow rate of the second plating liquid 75c. Further, the second plating liquid 75c supplied from the second substitution plating liquid supply unit 75 is substantially same as the second plating liquid 72c supplied from the second film forming plating liquid supply unit 72 except a temperature thereof.

In the present example embodiment in the same manner as the first example embodiment illustrated in FIG. 1, although omitted in FIG. 10 for the sake of brevity, the pre-wet unit 57 configured to discharge the pre-wet liquid toward the substrate 2 may be included in the plating apparatus 20.

Plating Method

Figure 11:
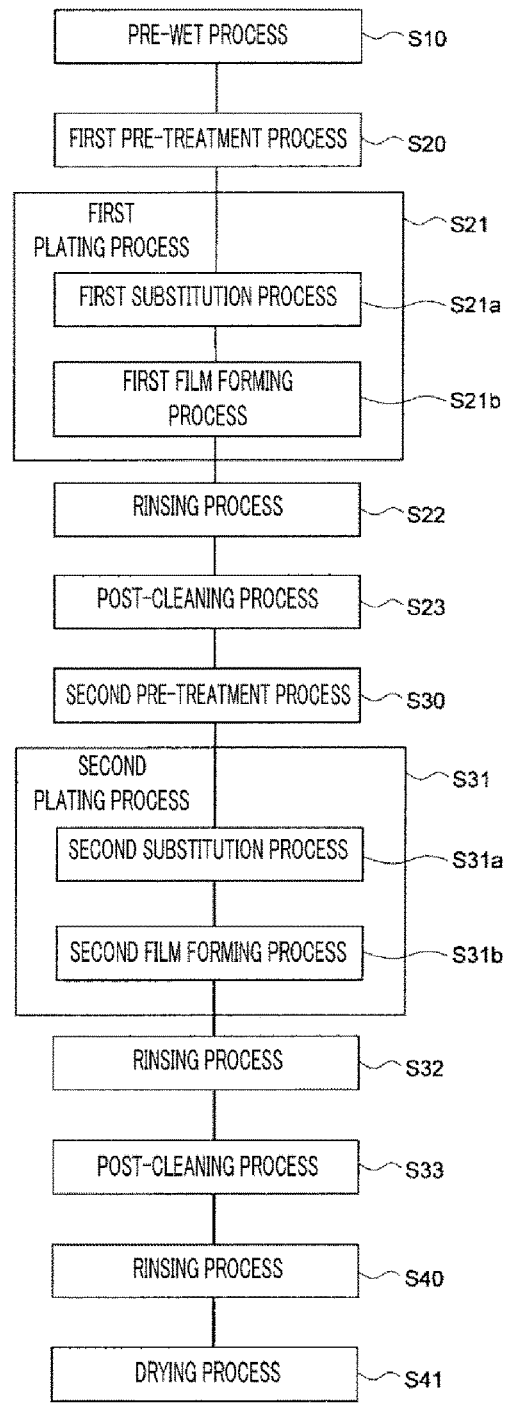
FIG. 11 is a flowchart showing a plating method in accordance with the second example embodiment.

Hereinafter, an operation and an effect of the present example embodiment configured as described above will be explained. There will be explained a plating method of forming a barrier film of CoWB by an electroless plating process on the inner surface 12a of the recess 12 formed in the substrate 2. FIG. 11 is a flowchart showing a plating method. Further, FIG. 12A to FIG. 12D are cross-sectional views illustrating the substrate 2 in the respective processes of the plating method.

Figure 12A:
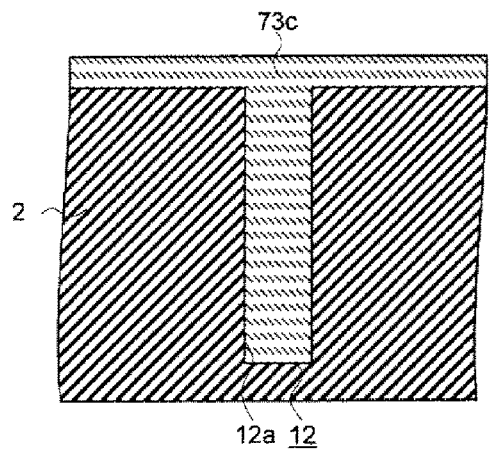
FIG. 12A is a diagram illustrating a process of preparing a substrate in which a recess is formed.
Figure 12B:
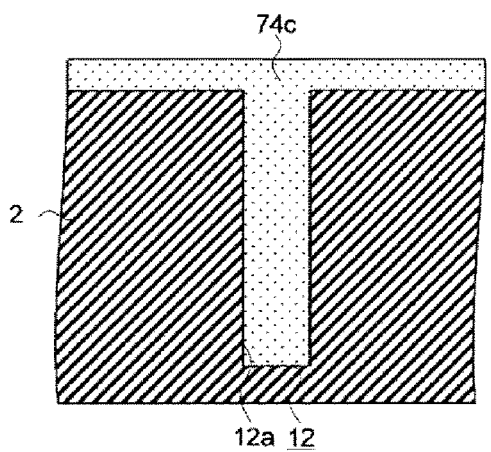
FIG. 12B is a diagram illustrating a first substitution process of substituting the first pre-treatment liquid filled in the recess of the substrate with the first plating liquid.

Firstly, the substrate 2 in which the recess 12 is formed is prepared. Then, the pre-wet process (S10) and the first pre-treatment process (S20) are performed in the same manner as the first example embodiment. Thus, as depicted in FIG. 12A, the inside of the recess 12 is filled with the first pre-treatment liquid 73c.

Thereafter, in the first plating unit 30, the first plating liquid 71c for forming a film of CoWB is discharged toward the substrate 2 (First plating process (S21)). The first plating process (S21), as depicted in FIG. 11, includes a first substitution process (S21a) of discharging the low-temperature first plating liquid 74c toward the substrate 2 and a first film forming process (S21b) of discharging the high-temperature first plating liquid 71c toward the substrate 2.

In the first substitution process (S21a), the first substitution plating liquid supply unit 74 supplies the low-temperature first plating liquid 74c to the first substitution unit 55. The supplied first plating liquid 74c has a temperature, for example, room temperature (about 25° C.), at which a plating reaction cannot proceed actively. Then, the first plating liquid 74c is discharged toward the substrate 2 from the discharge nozzle 55a provided in the discharge head 53.

As described above, in the recess 12 having a large depth, each component contained in the first plating liquid 74c reaches to the bottom of the recess 12 based on mainly diffusion in the plating liquid. Diffusion is a phenomenon that gradually proceeds as times passes. For this reason, each component of the first plating liquid 74c takes a preset time to sufficiently reach to the bottom of the recess 12. Therefore, the first substitution process (S21a) of supplying the first plating liquid 74c toward the substrate 2 is continuously performed for a preset time to sufficiently substitute the first pre-treatment liquid 73c within the recess 12 with the first plating liquid 74c.

Hereinafter, there will be explained an example of a method for determining a continuation time of the first substitution process (S21a).

Generally, abnormal diffusion in a plating liquid can be represented by the Fick's second law of diffusion as follows:

$$\frac{\partial C}{\partial t} = D \frac{\partial^2 C}{\partial x^2} \quad \text{[Equation 1]}$$

Figure 15:
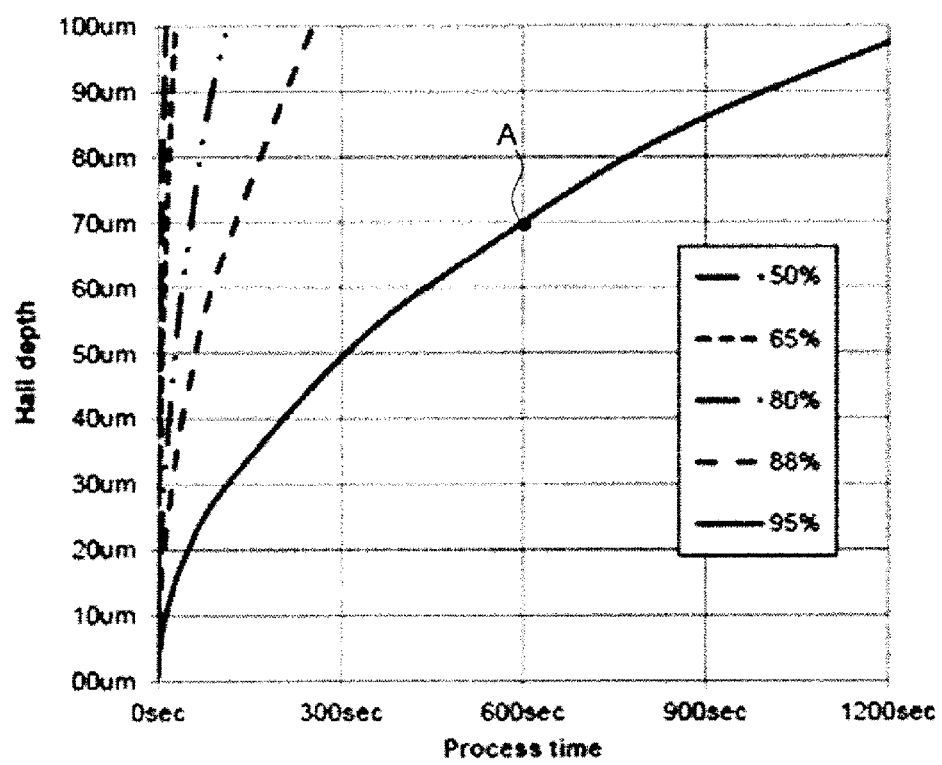
FIG. 15 is a diagram illustrating a relationship between a diffusion time and a diffusion distance when components of the plating liquid are diffused in the substitution process.

Herein, D is a diffusion coefficient of a component to be diffused; C is a concentration of the component to be diffused; t is a time; and x is a distance from a reference position. A relationship between a diffusion time and a diffusion distance when a plating component (a component of a material constituting a plating layer) in a plating liquid is calculated based on the Fick's second law of diffusion, and a result thereof is as shown in FIG. 15. In FIG. 15, the horizontal axis represents a time, and the longitudinal axis represents a distance from an upper end of the recess 12. Further, the calculation is carried out on the presumption that in the case of time (t)=0, the inside of the recess 12 is filled with the first pre-treatment liquid 73c only, and in the case of time (t)=0, the liquid present above the upper end of the recess 12 is substituted with the first plating liquid 74c. Furthermore, a depth of the recess 12 is presumed infinite. Further, in FIG. 15, the solid lines or the dashed lines annotated as "x % (x=50, 65, 80, 88, or 95)" represent a diffusion time required for a concentration of a plating component at a corresponding distance to reach x % of a concentration of a plating component at the upper end of the recess 12. By way of example, the dot with symbol A in FIG. 15 means a diffusion time of 600 seconds which is required for a concentration of a plating component at a position 70 μm away from the upper end of the recess 12 to reach 95% of a concentration of a plating component at the upper end of the recess 12.

Based on the relationship as shown in FIG. 15, a continuation time of the first substitution process (S21a) can be determined. By way of example, as for the recess 12 having a depth of 100 μm, if a concentration of a plating component at the bottom of the recess 12 is required to reach about 90% of a concentration of a plating component of the first plating liquid 74c supplied to the substrate 2, a continuation time of the first substitution process (S21a) is set to about 600 seconds. Since the first substitution process (S21a) is continued for such a long time, the first plating liquid 74c can sufficiently reach to the bottom of the recess 12. Thus, a concentration distribution of the first plating liquid 74c filled in the recess 12 can be substantially uniform.

Further, in the present example embodiment, as described above, the temperature of the first plating liquid 74c to be supplied to the substrate 2 in the first substitution process (S21a) is set to a low level at which a plating reaction cannot proceed actively. By way of example, the temperature of the first plating liquid 74c is set such that a film forming rate of the first plating layer 13 formed during the first substitution process (S21a) has 10% or less of a film forming rate of the first plating layer 13 finally formed of the high-temperature plating liquid. For this reason, it is possible to suppress significant progress of a plating reaction before the first plating liquid 74 sufficiently reaches to the bottom of the recess 12.

Figure 12C:
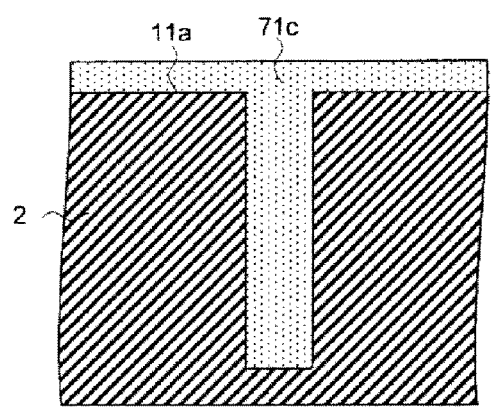
FIG. 12C is a diagram illustrating a first film forming process of supplying the first plating liquid to the substrate.

Then, the first film forming unit 35 discharges the high-temperature first plating liquid 71c toward the substrate 2 (First film forming process (S21b)). To be specific, the first film forming plating liquid supply unit 71 supplies the first plating liquid 71c heated to a high temperature to the first film forming unit 35. The supplied first plating liquid 71c has a temperature, for example, 45° C., at which a plating reaction can proceed at an appropriate rate. Then, the first plating liquid 71c is discharged toward the substrate 2 from the multiple discharge nozzles 34 arranged in parallel with each other along the radial direction of the substrate 2. Thus, as depicted in FIG. 12C, the low-temperature first plating liquid 74c in the recess 12 is substituted with the high-temperature first plating liquid 71c. Herein, in accordance with the present example embodiment, as described below, it is possible to rapidly fill the inside of the recess 12 with the high-temperature first plating liquid 71c.

When the first film forming process (S21b) is started, as described above, the low-temperature first plating liquid 74c is already filled in the recess 12. In this case, if the high-temperature first plating liquid 71c is supplied to the substrate 2, above the upper end of the recess 12, i.e., above an upper surface 11a of the substrate 2, the low-temperature first plating liquid 74c is substituted with the high-temperature first plating liquid 71c. Then, the low-temperature first plating liquid 74c filled in the recess 12 is heated by heat from the high-temperature first plating liquid 71c. Herein, generally, a velocity of thermal conduction in a liquid is higher than a velocity of diffusion of a certain component in the liquid. For this reason, the low-temperature first plating liquid 74c within the recess 12 is rapidly heated to be changed into the high-temperature first plating liquid 71c. That is, the inside of the recess 12 can be rapidly filled with the high-temperature first plating liquid 71c. Further, although the first plating liquid 74c and the first plating liquid 71c are assigned different reference numerals, they are substantially the same except a temperature thereof as described above. Therefore, by heating the low-temperature first plating liquid 74c, it is possible to substitute or change the low-temperature first plating liquid 74c into the high-temperature first plating liquid 71c.

Figure 12D:
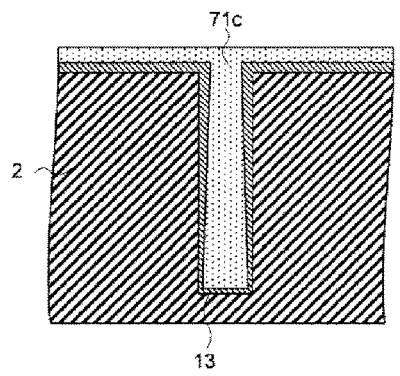
FIG. 12D is a diagram illustrating that a first plating layer is formed on an inner surface of the recess.

When the inside of the recess 12 is filled with the high-temperature first plating liquid 71c, as depicted in FIG. 12D, the first plating layer 13 is formed on an inner surface 12a of the recess 12. Herein, as described above, the high-temperature first plating liquid 71c within the recess 12 is obtained by heating the low-temperature first plating liquid 74c having a substantially uniform concentration distribution within the recess 12. For this reason, in accordance with the present example embodiment, a concentration distribution of the first plating liquid 71c within the recess 12 can be more uniform as compared with the above-described first example embodiment. Thus, the plating reaction in the first film forming process (S21b) can be started using the first plating liquid 71c having a substantially uniform concentration distribution regardless of positions within the recess 12. Thus, it is possible to increase uniformity in thickness of the first plating layer 13 formed on the inner surface 12a of the recess 12 and particularly formed first on the upper portion of the recess 12.

Then, as depicted in FIG. 11, a rinsing process (S22), a post-cleaning process (S23), and a second pre-treatment process (S30) are performed. Thus, the inside of the recess 12 in which the first plating layer 13 is formed is filled with a second pre-treatment liquid.

Then, the second plating unit 40 discharges a second plating liquid for forming the film of CoWB toward the substrate 2 (Second plating process (S31)). The second plating process (S31) includes, as depicted in FIG. 11, a second substitution process (S31a) of discharging the low-temperature second plating liquid 75c toward the substrate 2 and a second film forming process (S31b) of discharging the high-temperature second plating liquid 72c toward the substrate 2.

In the second substitution process (S31a), in the same manner as the above-described first substitution process (S21a), the second plating liquid 75c is supplied to the substrate 2 until the second pre-treatment liquid in the recess 12 is sufficiently substituted with the low-temperature second plating liquid 75c. Then, in the second film forming process (S31b), the low-temperature second plating liquid 75c in the recess 12 is sufficiently heated by heat from the high-temperature second plating liquid 72c having a high temperature. Thus, it is possible to rapidly fill the inside of the recess 12 with the high-temperature second plating liquid 75c having a substantially uniform concentration distribution. Thus, it is possible to increase uniformity in thickness of the second plating layer 14 formed on the first plating layer 13 and particularly formed first on the lower portion of the recess 12.

Then, post-treatments including rinsing processes (S32 and S40), a post-cleaning process (S33), and a drying process (S41) are carried out. As such, it is possible to increase uniformity in film thickness of the first plating layer 13 formed on the surface of the recess 12 and particularly formed first on the upper portion of the recess 12 and uniformity in film thickness of the second plating layer 14 particularly formed first on the lower portion of the recess 12. Thus, it is possible to obtain the substrate 2 on which a barrier film formed of the plating layer 15 including the first plating layer 13 and the second plating layer 14 is formed and the uniformity of the film thickness is improved.

In accordance with the present example embodiment, as described above, the plating processes (S21 and S31) include the substitution processes (S21a and S31a) using the low-temperature plating liquids 74c and 75c and the film forming processes (S21b and S31b) using the high-temperature plating liquids 71c and 72c, respectively. Since the plating process divided into the two processes is performed as such, when a plating reaction is carried out with the high-temperature plating liquids 71c and 72c, concentration distributions of the high-temperature plating liquids 71c and 72c within the recess 12 can be substantially uniform regardless of the positions within the recess 12. Thus, uniformity in thicknesses of the first plating layer 13 and the second plating layer 14 formed on the recess 12 can be increased. For this reason, uniformity in thickness of the plating layer 15 including the first plating layer 13 and the second plating layer 14 can be easily increased as compared with the case that uniformity in thickness of each of the plating layers 13 and 14 is low.

Modification Example

Further, in the present example embodiment, the first plating process (S21) and the second plating process (S31) include the substitution processes (S21a and S31a) and the film forming processes (S21b and S31b), respectively. However, the present example embodiment is not limited thereto, and in any one of the first plating process (S21) and the second plating process (S31), two processes including a substitution process and a film forming process may be performed. In this case, in the other one of the first plating process (S21) and the second plating process (S31), only a film forming process using the high-temperature plating liquid is performed.

Furthermore, in the present example embodiment, a processing liquid other than the plating liquid is supplied to the substrate 2 between the first plating process (S21) and the second plating process (S31). By way of example, there has been illustrated an example where the second pre-treatment process (S30) of supplying the second pre-treatment liquid toward the substrate 2 is performed between the first plating process (S21) and the second plating process (S31). However, the present example embodiment is not limited thereto, and the second plating process (S31) may be performed right after the first plating process (S21). In this case, the second plating process (S31) may include the second film forming process (S31b) only, or may include both of the second substitution process (S31a) and the second film forming process (S31b).

Figure 13:
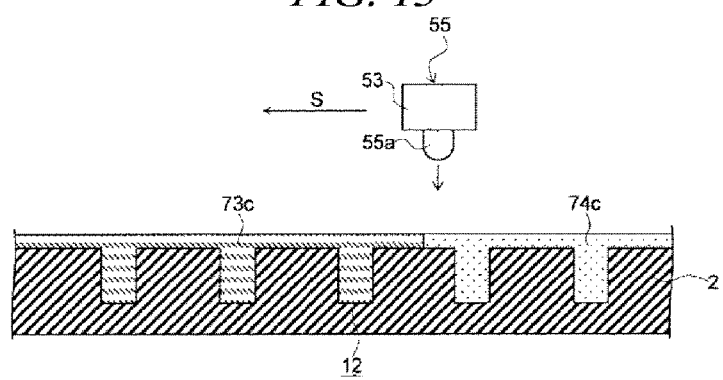
FIG. 13 is a diagram illustrating that the first pre-treatment liquid is substituted with the first plating liquid.

Moreover, in the first substitution process (S21a) of the present example embodiment, as depicted in FIG. 13, while the discharge head 53 is moved along a direction indicated by the arrow S, the first plating liquid 74c may be discharged toward the substrate 2 from the discharge nozzle 55a provided in the discharge head 53. In this case, a velocity component corresponding to a moving rate of the discharge head 53 is added to a velocity component of the discharged first plating liquid 74c. For this reason, it is possible to increase a force of the first plating liquid 74c for pressing the first pre-treatment liquid 73c along the direction S. Further, an impact force based on the kinetic energy of the first plating liquid 74c can be directly applied to the first pre-treatment liquid 73c filled in each recess 12. Thus, efficiency of substituting the first pre-treatment liquid 73c with the first plating liquid 74c can be increased. Furthermore, in the second substitution process (S31a), although not illustrated herein, the second plating liquid 75c may be discharged toward the substrate 2 from the discharge nozzle 56a provided in the discharge head 53 while the discharge head 53 is moved.

Further, the direction indicted by the arrow S is parallel with, for example, a direction from the central portion of the substrate 2 toward the peripheral portion of the substrate 2.

Figure 14:
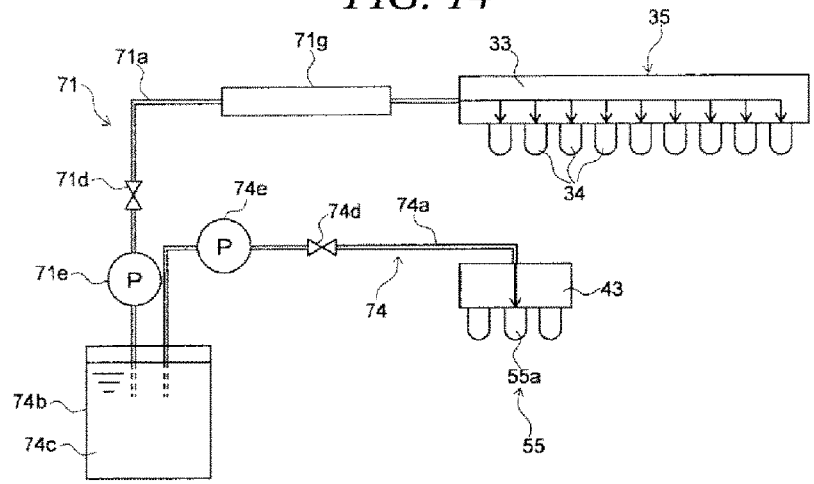
FIG. 14 illustrates a modification example of a first plating liquid supply unit configured to supply the first plating liquid to a first plating unit.

Moreover, in the present example embodiment, the tank 71b configured to supply the first plating liquid 71c to the first film forming unit 35 and the tank 74b configured to supply the first plating liquid 74c to the first substitution unit 55 are separately provided. However, the present example embodiment is not limited thereto. A tank configured to supply the first plating liquid 71c to the first film forming unit 35 and a tank configured to supply the first plating liquid 74c to the first substitution unit 55 may be commonly provided. By way of example, as depicted in FIG. 14, the tank 74b in which the first plating liquid 74c is stored may be used as a common tank. In this case, as depicted in FIG. 14, the heating unit 71g configured to heat a plating liquid is provided at the supply line 71a of the first film forming plating liquid supply unit 71. Thus, with a single tank, it is possible to supply the high-temperature first plating liquid 71c to the first film forming unit 35 and also possible to supply the low-temperature first plating liquid 74c to the first substitution unit 55.

Further, in some cases, the first plating liquid heated by the heating unit 71g may be required to be returned back to the tank 74b. In this case, although not illustrated, a transfer line configured to collect the high-temperature first plating liquid to the tank 74b may be further provided. Furthermore, a cooling unit configured to cool the plating liquid may be provided at the transfer line. Thus, the plating liquid cooled to a low temperature can be returned to the tank 74b. Moreover, the cooling unit provided at the transfer line and the above-described heating unit 71g provided at the supply line 71a may be configured as an integrated heat exchanger.

In the same manner as the case illustrated in FIG. 14, the tank configured to supply the second plating liquid 72c to the second film forming unit 45 and the tank configured to supply the second plating liquid 75c to the second substitution unit 56 may be commonly provided.

Furthermore, in the present example embodiment, the discharge nozzles 34 and 44 configured to respectively discharge the high-temperature plating liquids 71c and 72c and the discharge nozzles 55a and 56a configured to respectively discharge the low-temperature plating liquids 74c and 75c are separately provided. However, the present example embodiment is not limited thereto. The discharge nozzles configured to discharge the high-temperature plating liquids 71c and 72c and the discharge nozzles configured to discharge the low-temperature plating liquids 74c and 75c may be commonly provided.

Moreover, in the film forming processes (S21b and S31b) of the present example embodiment, the low-temperature plating liquids 74c and 75c already filled in the recess 12 are heated by supplying the high-temperature plating liquids 71c and 72c toward the substrate 2, respectively. However, a method for using high-temperature plating liquids with respect to the substrate 2 is not limited thereto. By way of example, by heating the substrate 2 or the turn table 112, the low-temperature plating liquids 74c and 75c already filled in the recess 12 in the substrate 2 are heated, so that the high-temperature plating liquids 71c and 72c can be obtained. Herein, a method of heating the substrate 2 is not particularly limited, and various methods may be used. By way of example, there may be used a lamp heater configured to irradiate light toward the substrate 2 from the below of the substrate 2. Further, a heat transfer medium such as hot water may be circulated below the substrate 2, so that the substrate 2 may be heated. If the substrate 2 is heated from the below, a plating liquid filled in the recess 12 is heated from a lower portion of the recess 12. It is advantageous to heat a plating liquid from the lower portion of the recess 12 in the case of using a plating liquid for forming a plating layer first on an upper portion of the recess 12. This is because a plating reaction can be first started at the lower portion of the recess 12 by heating the plating liquid from the lower portion of the recess 12. As a result, it is possible to reduce a difference between a thickness of a plating layer formed on the lower portion of the recess 12 and a thickness of a plating layer formed on the upper portion of the recess 12.

Further, in the present example embodiment, the barrier film formed of the plating layer 15 is directly formed on the inner surface 12a of the recess 12 formed in the substrate 2. However, the present example embodiment is not limited thereto. Another layer may be interposed between the inner surface 12a of the recess 12 and the barrier film. By way of example, a catalyzer layer for promoting a plating reaction may be interposed between the inner surface 12a of the recess 12 and the barrier film. A material of the catalyzer layer is appropriately selected depending on a material of the plating layer. By way of example, if the plating layer contains CoWB, the material of the catalyzer layer may be Pd (palladium). An adhesion layer for improving adhesivity between the inner surface 12a of the recess 12 and the catalyzer layer may be further formed. The adhesion layer may be formed by performing a SAM process using a coupling agent such as a silane coupling agent. Further, an insulating film such as TEOS or PI (polyimide) may be formed on the inner surface 12a of the recess 12.

Furthermore, in the above-described example embodiments, the plating apparatus 20 is a single-substrate processing apparatus that performs a plating process to a single substrate 2 by discharging a plating liquid to the substrate 2. However, a plating apparatus to which the technical concept of the example embodiments can be applied is not limited to the single-substrate processing apparatus. By way of example, the plating apparatus in accordance with the example embodiments may be a so-called dip-type processing apparatus capable of performing a plating process to multiple substrates 2 in a lump. In the dip-type processing apparatus, by dipping the substrate 2 into a plating tank in which a plating liquid is stored and preserved, the plating liquid is supplied to the substrate 2. The other configuration is substantially the same as the above-described single-substrate plating apparatus 20, and detailed explanation thereof will be omitted.

Although several modification examples of each of the above-described example embodiments have been explained, it is possible to apply an appropriate combination of the multiple modification examples.

Experimental Example

There will be explained an example where the plating layer 15 of CoWB is formed on the inner surface 12a of the recess 12 in the substrate 2 using the above-described plating apparatus 20.

Firstly, the substrate 2 in which the recess 12 is formed is prepared. A diameter of the recess 12 is 8 µm, and a depth of the recess 12 is 100 µm.

Then, the pre-wet process (S10) is performed. Thereafter, the first pre-treatment process (S20) of discharging the first pre-treatment liquid toward the substrate 2 is performed. Thus, the inside of the recess 12 is filled with the first pre-treatment liquid. As the first pre-treatment liquid, DIW to which the deaeration process is performed is used.

Then, the first plating process (S21) of forming the first plating layer 13 on the inner surface 12a of the recess 12 is performed. To be specific, the substitution process (S21a) of discharging the first plating liquid having a temperature of 25° C. toward the substrate 2 is performed for 10 minutes. Then, the first film forming process (S21b) of discharging the first plating liquid having a temperature of 45° C. toward the substrate 2 is performed for 20 minutes. A concentration of SPS contained in each first plating liquid is 0 ppm.

Then, the second pre-treatment process (S30) of supplying the second pre-treatment liquid to the substrate 2 and thus filling the inside of the recess 12 with the second pre-treatment liquid is performed for 10 minutes. As the second pre-treatment liquid, DIW to which the deaeration process is performed is used.

Then, the second plating process (S31) of forming the second plating layer 14 on the inner surface 12a of the recess 12 is performed. To be specific, the second substitution process (S31a) of discharging the second plating liquid of 25° C. toward the substrate 2 is performed first for 10 minutes. Then, the second film forming process (S31b) of discharging the second plating liquid of 45° C. toward the substrate 2 is performed for 30 minutes. Further, a concentration of SPS contained in each second plating liquid is 5 ppm. As such, the plating layer 15 including the first plating layer 13 and the second plating layer 14 is obtained. Thereafter, an appropriate post-treatment such as the rinsing process (S32) is performed.

Figure 16:
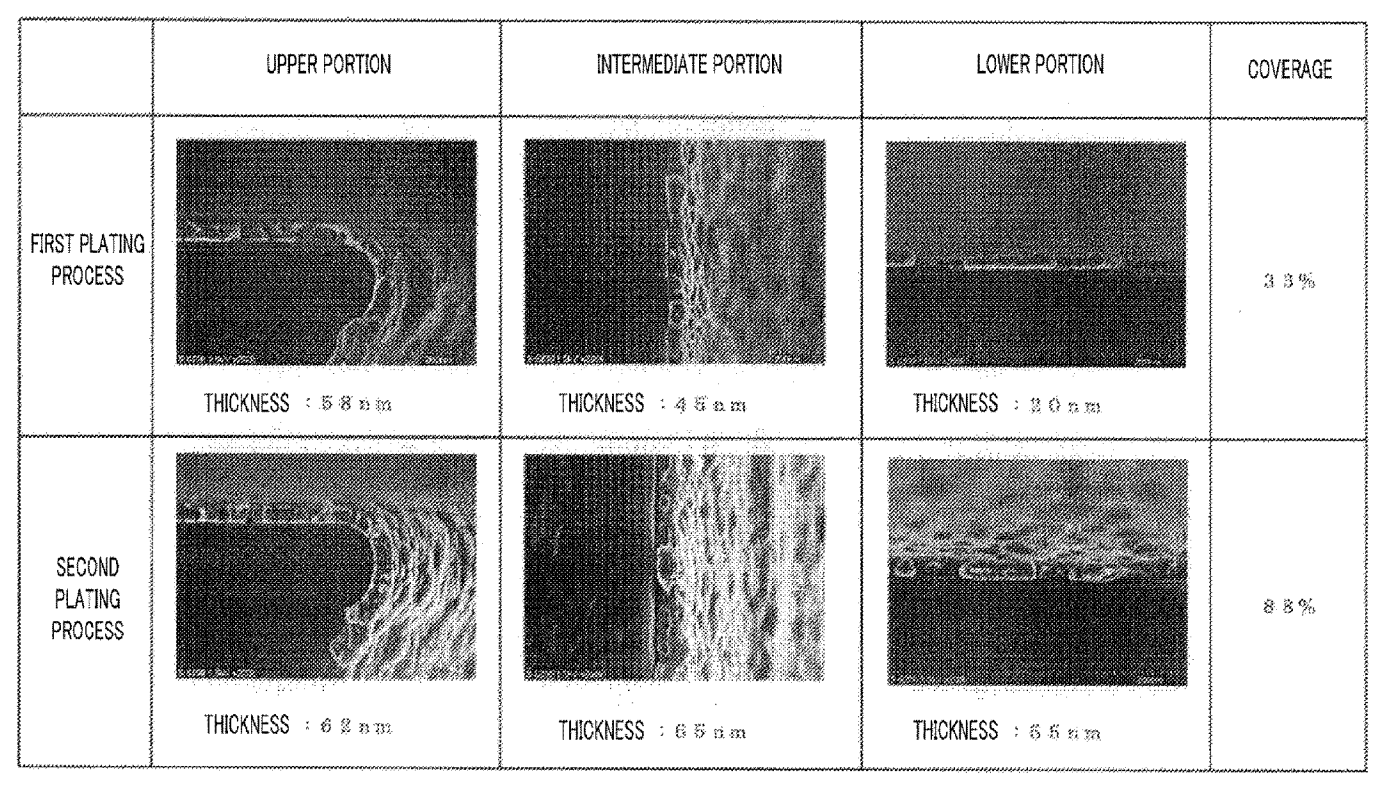

The plating layer formed by the each plating process is observed. To be specific, the plating layers formed at the upper portion of the recess 12, the lower portion (bottom) thereof, and the intermediate portion between the upper portion of the recess 12 and the lower portion thereof is observed after the first plating process (S21) is completed and after the second plating process (S31) is completed, respectively. A result thereof is as shown in FIG. 16. FIG. 16 also shows the thicknesses of the formed plating layers.

As depicted in FIG. 16, the first plating layer 13 formed by the first plating process (S21) has a thickness of 58 nm at the upper portion of the recess 12, a thickness of 45 nm at the intermediate portion of the recess 12, and a thickness of 20 nm at the bottom of the recess 12. In this case, a bottom coverage is 33%. Further, the term "coverage" refers to a ratio of the thickness at the lower portion (bottom) of the recess 12 to the thickness at the upper portion of the recess 12.

Further, the plating layer 15 including the first plating layer 13 formed by the first plating process (S21) and the second plating layer 14 formed by the second plating process (S31) has a thickness of 62 nm at the upper portion of the recess 12, a thickness of 65 nm at the intermediate portion of the recess 12, and a thickness of 55 nm at the bottom of the recess 12. In this case, a bottom coverage is 88%. As such, in accordance with the present experimental example, a thickness of the plating layer 15 formed on the upper portion of the recess 12 can be substantially the same as a thickness of the plating layer 15 formed on the lower portion of the recess 12.

EXPLANATION OF REFERENCE NUMERALS

2: Substrate
12: Recess
13: First plating layer
14: Second plating layer
15: Plating layer
20: Plating apparatus
30: First plating unit
40: Second plating unit
101: Casing
110: Substrate holding unit

We claim:

1. A plating method of performing an electroless plating process to a recess formed in a substrate, the plating method comprising:
   a loading process of loading the substrate in which the recess is formed into a casing;
   a plating process of supplying a plating liquid to the substrate and forming a combined plating layer which is a barrier film or a seed film, on an inner surface of the recess; and
   a burying process of burying a wiring material into the recess on which the combined plating layer has been formed,
   wherein the plating process includes a first plating process of supplying a first plating liquid to the substrate and forming a first plating layer; and a second plating process of supplying a second plating liquid to the substrate and forming a second plating layer on the first plating layer, and
   a concentration of an additive contained in the first plating liquid is different from a concentration of an additive contained in the second plating liquid,
   a thickness of the first plating layer formed on the inner surface of the recess is greater at an upper portion of the recess than at a lower portion of the recess,
   a thickness of the second plating layer formed on the inner surface of the recess is greater at the lower portion of the recess than at the upper portion of the recess, and
   a thickness of the combined plating layer including the first layer and the second layer is uniform regardless of positions within the recess.

2. The plating method of claim 1,
   wherein a concentration of the additive contained in any one of the first plating liquid and the second plating liquid is set such that a plating reaction rate on an upper portion of the recess is higher than a plating reaction rate on a lower portion of the recess, and a concentration of the additive contained in the other plating liquid is set such that the plating reaction rate on the lower portion of the recess is higher than the plating reaction rate on the upper portion of the recess.

3. The plating method of claim 1,
wherein each of the additive contained in the first plating liquid and the additive contained in the second plating liquid is formed of bis (3-sulfopropyl) disulfide.

4. The plating method of claim 3,
wherein a concentration of the bis (3-sulfopropyl) disulfide contained in the first plating liquid is lower than a concentration of the bis (3-sulfopropyl) disulfide contained in the second plating liquid.

5. The plating method of claim 1, further comprising:
a first pre-treatment process of supplying a first pre-treatment liquid toward the substrate before the first plating process,
wherein the first plating process includes a first substitution process of supplying a first plating liquid to the substrate and substituting the first pre-treatment liquid filled in the recess in the substrate with the first plating liquid; and a first film forming process of supplying a first plating liquid to the substrate and forming the first plating layer after the first substitution process, and
a temperature of the first plating liquid used in the first substitution process is lower than a temperature of the first plating liquid used in the first film forming process.

6. The plating method of claim 1,
wherein the second plating process includes a second substitution process of supplying a second plating liquid to the substrate; and a second film forming process of supplying a second plating liquid to the substrate and forming the second plating layer after the second substitution process, and
a temperature of the second plating liquid used in the second substitution process is lower than a temperature of the second plating liquid used in the second film forming process.

7. The plating method of claim 6, further comprising:
a second pre-treatment process of supplying a second pre-treatment liquid to the substrate after the first plating process and before the second plating process,
wherein, in the second substitution process, the second pre-treatment liquid filled in the recess formed in the substrate is substituted with the second plating liquid.

\* \* \* \* \*